(12) United States Patent
Martin et al.

(10) Patent No.: US 11,146,280 B2
(45) Date of Patent: Oct. 12, 2021

(54) DIGITAL SIGNAL PROCESSING WAVEFORM SYNTHESIS FOR FIXED SAMPLE RATE SIGNAL SOURCES

(71) Applicant: Tektronix, Inc., Beaverton, OR (US)

(72) Inventors: Gregory A. Martin, Lake Oswego, OR (US); Patrick Satarzadeh, San Jose, CA (US); John J. Pickerd, Hillsboro, OR (US); Daniel G. Knierim, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 16/554,548

(22) Filed: Aug. 28, 2019

(65) Prior Publication Data

US 2020/0212923 A1 Jul. 2, 2020

Related U.S. Application Data

(60) Provisional application No. 62/787,192, filed on Dec. 31, 2018.

(51) Int. Cl.
| | | |
|---|---|---|
| H03M 1/66 | (2006.01) | |
| H03M 1/10 | (2006.01) | |
| H03M 1/00 | (2006.01) | |

(52) U.S. Cl.
CPC ......... *H03M 1/1071* (2013.01); *H03M 1/005* (2013.01); *H03M 1/661* (2013.01)

(58) Field of Classification Search
CPC ..... H03M 1/1071; H03M 1/005; H03M 1/661
USPC ....................................................... 341/144
See application file for complete search history.

(56) References Cited

U.S. PATENT DOCUMENTS

| | | | | |
|---|---|---|---|---|
| 4,068,178 | A  * | 1/1978 | Tunzi ..................... | H03K 4/026 |
| | | | | 327/107 |
| 6,236,283 | B1 | 5/2001 | Koslov | |
| 6,255,866 | B1 * | 7/2001 | Wolaver ................. | G06F 1/025 |
| | | | | 327/105 |
| 7,738,613 | B1 | 6/2010 | Andersen et al. | |
| 7,952,396 | B1 | 5/2011 | Hunter et al. | |
| 9,100,030 | B1 * | 8/2015 | Haisch ...................... | G06F 1/03 |
| 9,491,012 | B1 * | 11/2016 | Balakrishnan ........... | H04B 1/04 |
| 2014/0169442 | A1 | 6/2014 | Hashida et al. | |
| 2016/0064639 | A1 * | 3/2016 | Park ...................... | H01L 41/042 |
| | | | | 310/317 |

OTHER PUBLICATIONS

European Patent Office, Extended European Search Report and Written Opinion for European Application No. 19220207.5, dated May 25, 2020, 8 pages, Munich, Germany.

* cited by examiner

*Primary Examiner* — Peguy Jean Pierre
(74) *Attorney, Agent, or Firm* — Miller Nash LLP; Andrew J. Harrington

(57) ABSTRACT

A test and measurement instrument including a digital-to-analog converter having an output sample rate configured to receive a digital sample waveform and a reference clock and output an analog waveform at the sample rate, a waveform synthesizer configured to receive an input waveform having a baud rate and output a digital sample waveform having a baud rate less than the sample rate of the digital-to-analog converter, and a port configured to output the analog waveform.

20 Claims, 6 Drawing Sheets

DIGITAL SIGNAL PROCESSING WAVEFORM SYNTHESIS FOR FIXED SAMPLE RATE SIGNAL SOURCES

CROSS-REFERENCE TO RELATED APPLICATIONS

This application claims the benefit of provisional U.S. Pat. App. No. 62/787,192, filed Dec. 31, 2018, the entire contents of which are hereby incorporated by reference into this application.

TECHNICAL FIELD

This disclosure is directed to systems and methods related to test and measurement systems, and in particular, to synthesizing a waveform for a fixed sample rate signal source.

BACKGROUND

Conventional signal sources that synthesize waveforms for data communication applications typically use a sample rate that is an integer multiple of the desired baud rate of the generated waveform. These waveforms can include signaling techniques such as non-return to zero (NRZ), pulse-amplitude modulation (PAM), quadrature amplitude modulation (QAM) across two synchronized channels for in-phase (I) and quadrature (Q) signal components, such as for coherent optical communication applications, etc.

With the traditional waveform generation approach, the signal source may use a simple replication of the waveform symbol values by a constant integer interpolation factor to up-sample from the waveform baud rate to the sample rate used by a digital-to-analog converter (DAC). At a minimum, supporting waveform generation for arbitrary baud rates with the traditional synchronous waveform synthesis approach requires a reference clock and a DAC sample rate that can vary over a full octave in frequency, that is, vary across a 1:2 times frequency range, that is synchronized to the desired waveform baud rate by an integer ratio.

However, designing synchronous waveform generation with high-speed DACs and signal sources that can vary across a full octave in sampling frequency can be challenging. Also, changing the DAC sampling frequency to support different waveform baud rates for test and measurement applications that require switching between several different baud rates can often require time-consuming re-calibration to be performed, as many DAC impairments can be sensitive to the sample rate.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Embodiments of the disclosure may solve the challenges of the conventional and traditional techniques by using digital signal processing (DSP) to synthesize waveforms with an asynchronous fixed rate DAC, or narrowly tunable rate DAC, that is oversampled relative to a target waveform baud rate. As will be discussed in more detail below, embodiments of the disclosure can support arbitrary waveform baud rates through fractional replication/interpolation techniques in DSP to up-sample the waveform at the desired baud rate to the sample rate of the DAC.

Embodiments of the disclosure, with a fixed rate DAC, or narrowly tunable rate DAC, and signal source, are advantageous over the traditional integer replication approach with a DAC and signal source that can vary its sample rate by at least over an octave because a high-speed fixed-rate DAC can be easier to design and optimize relative to variable sample rate DACs. This is true even for instances where the fixed-rate DAC is higher in sample rate than a comparable variable sample rate DAC.

Further, embodiments of the disclosure can allow the fixed-rate DAC, or narrowly tunable rate DAC, and sample signal to be calibrated once and then the waveform baud rate can be dynamically changed without requiring recalibration. Some of the DSP waveform synthesis embodiments used to replicate and/or interpolate the waveform with a fractional ratio can also be leveraged to dynamically modulate the symbol period during waveform generation to introduce spread spectrum clocking, add jitter impairments, and/or other timing or phase related impairments to the generated waveform for stress testing applications with the signal source.

Embodiments disclosed herein can be implemented either in real-time DSP hardware, such as a field programmable gate array (FPGA) or Application Specific Integrated Circuits (ASICs) or by pre-computation, if replication/interpolation of a waveform is done in advance and loaded to a waveform pattern memory in the signal source that is used to generate the real-time output waveform at the DAC sample rate.

Figure 1:
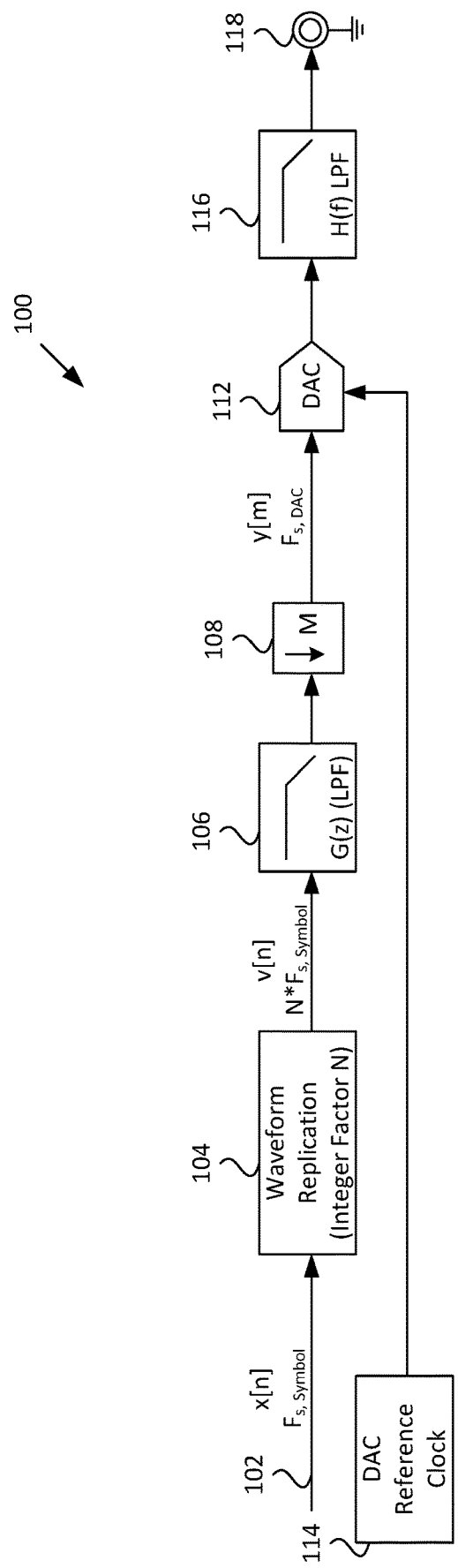
FIG. 1 is a block diagram of a test and measurement instrument having a waveform synthesizer according to some embodiments of the disclosure.

FIG. 1 is a block diagram of a test and measurement instrument 100 having a waveform synthesizer according to some embodiments of the disclosure. An input waveform 102, x[n] is a digital representation of the desired output waveform symbol values to be generated, which may be sampled at the baud rate of the waveform to be synthesized ($F_{s,\ symbol}$). The input waveform 102 can be received at waveform synthesizer 104, which replicates the waveform by an integer factor, N, to up-sample the input waveform to a higher sample rate. Up-sampling the input waveform 102 by larger factors, such as by ten times or more, will improve the time resolution in mapping to the output asynchronous sample rate of DAC 112 and can reduce the artifacts introduced in the process, but will also increase the hardware complexity if it is implemented using real-time DSP. The input waveform 102 can have a baud rate that may be less than the sample rate of DAC 112 by a non-integer rational ratio.

Once the input waveform 102 has been replicated by N, a low pass filter 106, G(z), is applied to remove signal content above the Nyquist frequency of the DAC 112, as well as perform any other desired shaping of the output waveform's frequency and transient response characteristics, which can include pre-emphasis to compensate for the response of the DAC 112 and/or the downstream channel signal path.

After the low-pass filter 106, the data is down-sampled 108 by M to reduce the sample rate to match the output sample rate of the DAC 112. In some embodiments, M is a constant integer value. However, in other embodiments, M may be a fractional down-sample factor, which can be supported by dithering the down-sample factor M used each DAC sample period in synthesizing the output waveform. That is, the M factor can alternate between successive integer values so that the mean down-sample factor averaged over many DAC sample periods achieves the desired fractional down-sample factor.

Based on the above, the waveform baud rate is determined by equation (1):

$$F_{s,Symbol} = F_{s,DAC} \frac{M}{N} \qquad (1)$$

The down-sampled waveform, y[m], is received at the DAC 112 and converted to an analog signal. The DAC 112 also may receive a reference clock 114 from another component of the test and measurement instrument 100. After the waveform is converted to an analog signal through the DAC 112, the analog waveform may be filtered by an analog low-pass filter 116, H(f), that is used to remove signal content above the first Nyquist zone of the DAC 112. This can remove the zero-order hold effects of traditional DACs in the higher Nyquist zones, which causes $sin(\pi f)/(\pi f)$ replication of the waveform spectrum in the first Nyquist zones across the higher Nyquist zones, which can be undesirable for cases where the DAC sample rate is not related to the input waveform baud rate by an integer up-sample factor due to artifacts it can create in the output waveform, such as when the baud rate is less than the sample rate of the DAC 112 by a non-integer rational ratio. The filtered waveform is output to a port 118 in the test and measurement instrument 100. A device under test may be connected to the port 118 through a cable (or optical fiber if an electrical-to-optical converter is used following the DAC 112 output) to receive the filtered analog waveform.

In embodiments or situations where the DAC 112 sample rate ($F_s$, DAC) is an integer multiple of the waveform baud rate ($F_{s,\ symbol}$), the analog low-pass filter 116 may be removed or bypassed, and the output from the DAC 112 may be sent directly to the port 118 since the zero-order hold response of the DAC 112 is coherent to the waveform that is being synthesized and can reinforce the desired symbol transitions in the output waveform.

In some embodiments, rather than a waveform replicator 104, low-pass filter 106, and down-sampler 108, waveforms may be synthesized using a direct linear interpolation resampler or a Farrow resampling filter structure, rather than the lowpass filter 106 discussed above. In such embodiments, the remaining components of the embodiment of FIG. 1 would remain the same.

Using a direct linear interpolation resampler, the DAC input samples, y[m], may be computed from the input waveform 102, x[n], using equations (2), (3), and (4), below.

$$n[m] = \left\lfloor \frac{m}{r} \right\rfloor \qquad (2)$$

$$\mu[m] = \frac{m}{r} - n[m] \qquad (3)$$

$$y[m] = (1 - \mu[m]) \cdot x[n[m]] + \mu[m] \cdot x[n[m] + 1] \qquad (4)$$

Where $$r = \frac{F_{s,DAC}}{F_{s,symbol}}.$$

That is, r is the ratio of output sample rate and the waveform baud rate. However, a limitation of the direct linear interpolation resampling approach is a degradation in the edge rise/fall time in the waveform that is synthesized relative to other approaches, such as the replication and decimation approach discussed above with respect to FIG. 1, assuming a reasonably sharp DSP low-pass filter 106 is used with a cut-off frequency near the Nyquist frequency of the DAC 112.

Figure 2:
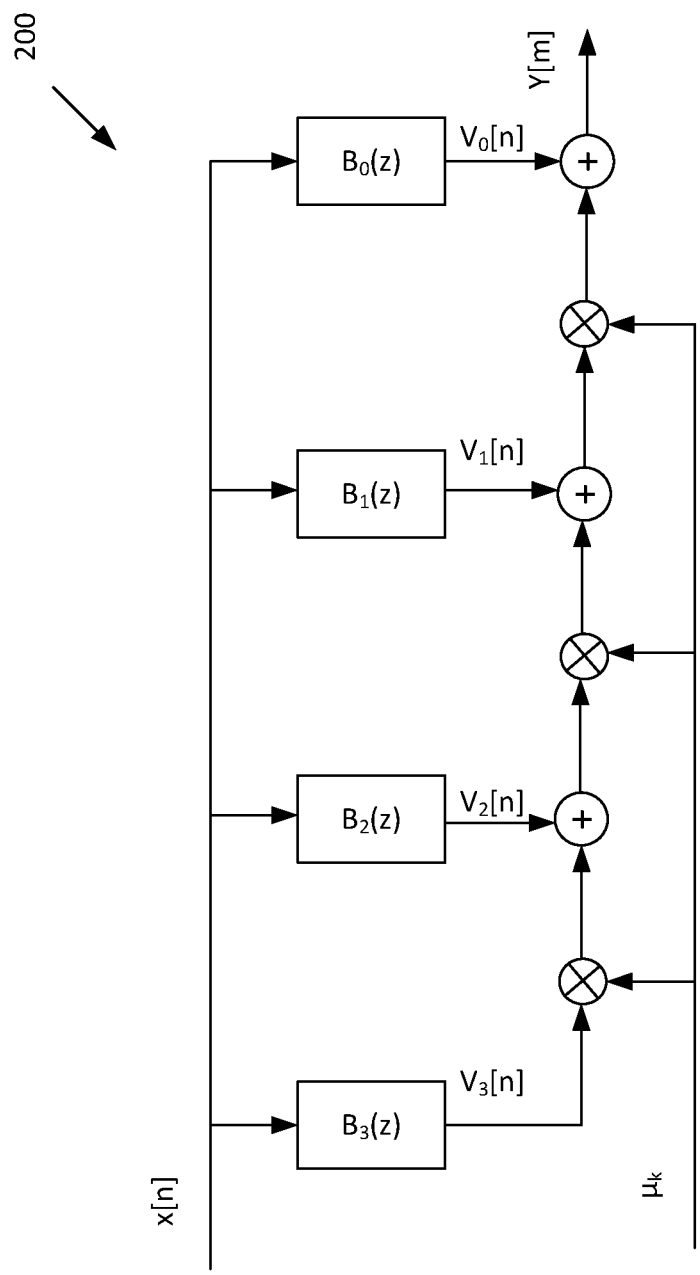
FIG. 2 is an example of a Farrow resampling filter according to some embodiments of the disclosure.

With the Farrow resampling filter 200, shown in FIG. 2 for cubic interpolation, the μ value would be dynamically varied each DAC 112 sample period to achieve the desired fractional resampling rate between the waveform baud rate ($F_{s,\ symbol}$) and the DAC 112 output sample rate ($F_{s,\ DAC}$).

The Farrow resampling filter 200 can include higher order terms to avoid a similar edge rise/fall time degradation as the direct linear interpolation resampling approach, at the expense of additional hardware complexity if embodiments are implemented using real-time DSP. However, the real-time DSP hardware complexity of the Farrow filter 200 may be less than the general DSP waveform replication and decimation approach shown in FIG. 1.

The direct linear interpolation resampler and Farrow filter 200 may be advantageous because the symbol period and the resulting transition between symbol values can be dynamically modulated in phase to support the insertion of spread spectrum clocking, jitter impairments, and/or other timing or phase related impairments in the output waveform, to support stressed impairment generation for test and measurement applications.

Figure 3:
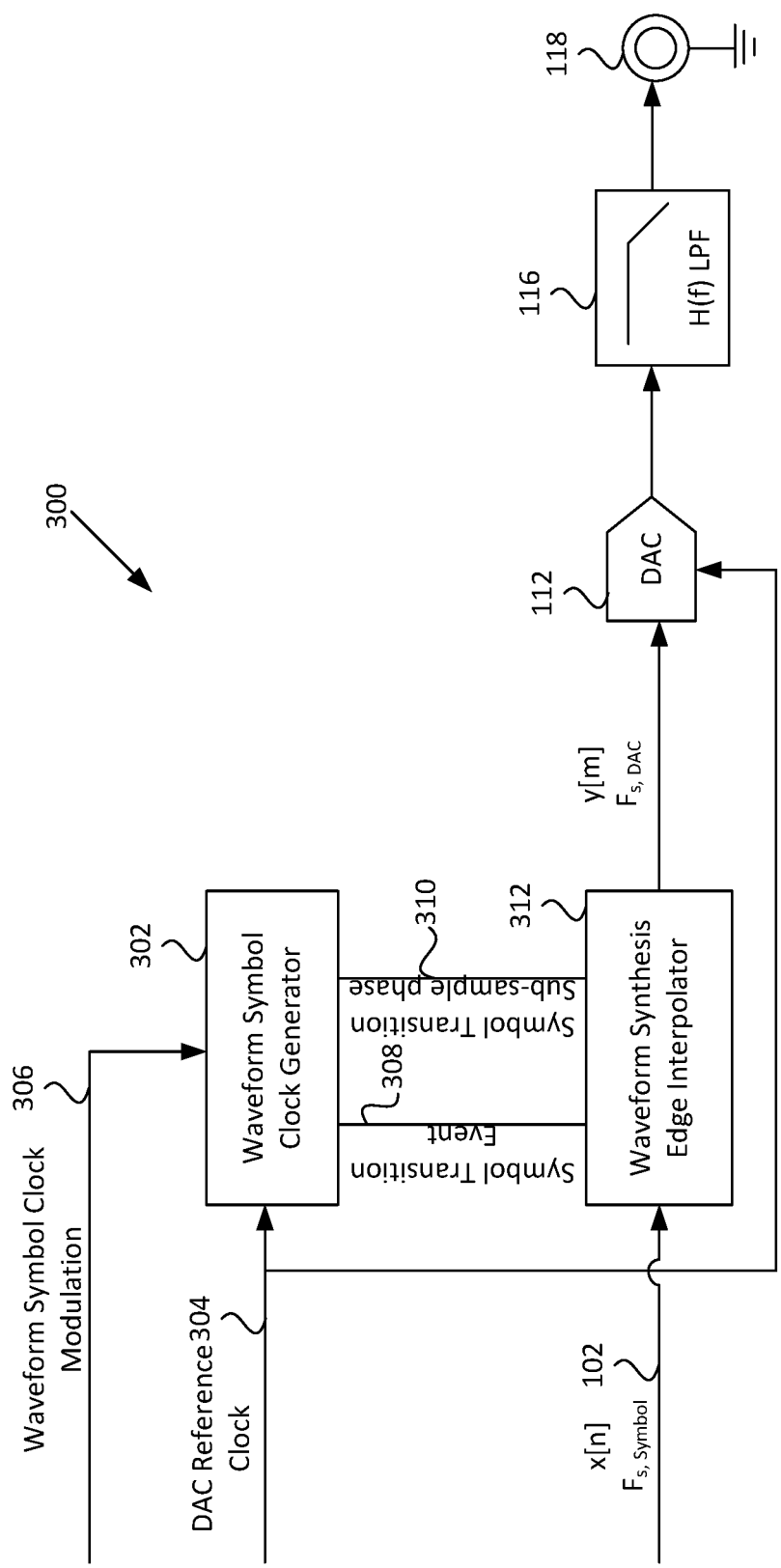
FIG. 3 is an example of a test and measurement instrument having another waveform synthesizer according to other embodiments of the disclosure.

FIG. 3 illustrates another embodiment of the disclosure for waveform synthesis with edge interpolation. The embodiment of FIG. 3 combines direct integer replication of symbol values with interpolation of a single DAC sample value at each symbol transition edge. This can be done to leverage the full resolution of an oversampled DAC 112 to improve the timing accuracy of the sub-sample edge crossing of the synthesized output waveform to minimize unintended jitter artifacts created in the synthesized waveform.

Waveform synthesis with edge interpolation, an example of which is shown in FIG. 3, has much lower hardware complexity for real-time DSP embodiments than the DSP waveform replication and decimation 100 or higher order Farrow filter 200 discussed above. There is also less degradation in rise/fall time compared to the direct linear interpolation resampling or low-order Farrow filter since interpolation is limited to a single sample for each symbol edge transition.

In the embodiment 300 shown in FIG. 3, a waveform symbol clock generator 302 can receive a DAC reference clock 304 from the test and measurement instrument and a waveform symbol clock modulation signal 306. The waveform symbol clock generator 302 outputs symbol transition events 308 and symbol transition sub-sample phase 310 to a waveform synthesis edge interpolator 312, which also receives the input signal 102, x[n]. The waveform synthesis edge interpolator 312 outputs a digital signal, y[m], to be converted to an analog signal through DAC 112. The embodiment of FIG. 3 also includes an analog filter 116 to filter the analog signal before being output to a port 118, similar to FIG. 1, and as such, these components will not be further described herein.

The waveform symbol clock generator 302 synthesizes a virtual waveform clock period, at the asynchronous input waveform baud rate, $F_{s,Symbol}$, with respect to the DAC output sample rate ($F_{s,DAC}$). The waveform symbol clock generator 302 can keep track of when each symbol's transition should occur in time based on equation (5) that determines the symbol period relative to DAC output samples:

$$T_S = \frac{F_{s,DAC}}{F_{s,Symbol}} \qquad (5)$$

The waveform symbol clock generator 302, which can be implemented as a counter with fractional sample time resolution, can keep track of the DAC 112 sample periods where symbol transitions 308 would occur as well as a fractional sub-sample component 310 that tracks where the symbol transition should occur between two adjacent DAC 112 samples that are asynchronous to the waveform that is being synthesized. The fractional sub-sample symbol transition times 310 are used as an input to the waveform synthesis edge interpolator 312. The goal of edge interpolation is to select a DAC 112 input sample that causes the symbol transition in the generated output waveform to occur at the desired sub-sample time between successive DAC 112 output samples in the output waveform generated by the signal source after factoring in the response of the DAC and the downstream analog signal path to the output port 118.

The following equations (6)-(8) describe the computation of the waveform symbol transition times by the waveform symbol clock generator 302 that are separated into components for the integer DAC sample transition events 308 ($k$) and sub-sample fractional transition phase components 310 ($\phi$) of successive symbol periods in synthesizing the output waveform at the DAC sample rate.

$$t[n+1]=t[n]+T_S \qquad (6)$$

$$k[n+1]=\text{round}(t[n+1]) \qquad (7)$$

$$\varphi[n+1]=t[n+1]-k[n+1], -0.5 \leq \varphi[n+1] < +0.5 \qquad (8)$$

The waveform synthesis edge interpolator 312 can be active for the output DAC samples with symbol period transitions, as computed by equation (7) above. Otherwise, the current waveform symbol value, x[n], is replicated until the next sample period transition occurs.

The sub-sample fractional symbol transition phase ($\phi[n]$) component 310 is used by the waveform synthesis edge interpolator 312 to compute an appropriate interpolated DAC value to achieve the desired symbol transition time in between successive DAC output samples.

The waveform synthesis edge interpolator 312 may operate in different ways to compute the interpolated DAC sample values. For example, the following equation (9), for symbol transitions, and equation (10), for the other samples following the transitions, may be used to interpolate the DAC sample value to use for each symbol period transition:

$$y[k[n+1]]=x[n]+(0.5-\varphi[n+1])\cdot(x[n+1]-x[n]) \qquad (9)$$

$$y[m]=x[n], m \in \{k[n]+1, \ldots, k[n+1]-1\} \qquad (10)$$

A waveform synthesis edge interpolator 312 using equations (9) and (10) can achieve the desired sub-sample decision threshold cross time, between symbol values, with a constant edge slope in the synthesized waveform.

Figure 4:
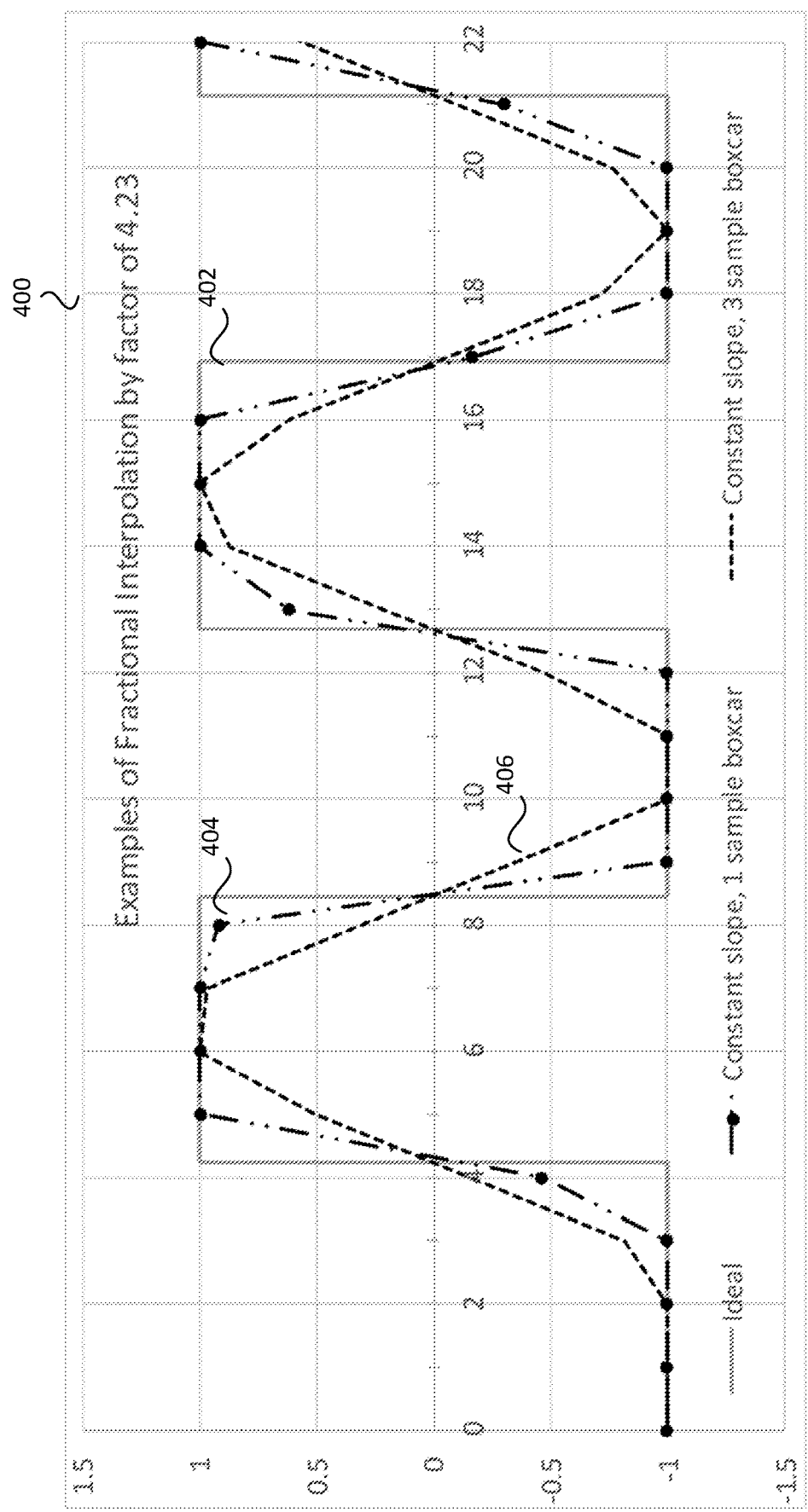
FIG. 4 is a results graph of linear edge interpolation according to embodiments of the disclosure.

FIG. 4 illustrates a plot 400. Plot 400 illustrates an ideal continuous-time waveform 402 (with a unit interval 4.23 times the DAC sample interval), an interpolated waveform 404 using equations (9) and (10), and an interpolated waveform 406 using equations (9) and (10), with a lower-bandwidth output channel.

Alternatively, rather than keeping the edge slope constant for each symbol transition, as discussed above, the waveform synthesis edge interpolator 312 may vary the edge slope in some embodiments to achieve the desired sub-sample decision threshold cross time between symbol values. This is described in equations (11)-(15):

$$t[n+1] = t[n] + T_S \qquad (11)$$

$$k[n+1] = \lfloor t[n+1] \rfloor \qquad (12)$$

$$\varphi[n+1] = t[n+1] - k[n+1], 0 \leq \varphi[n+1] < 1 \qquad (13)$$

$$\mu[n+1] = \frac{x[n] + x[n+1]}{2} \qquad (14)$$

$$\begin{cases} y[k[n+1]] = x[n+1] - \frac{x[n+1] - \mu[n+1]}{1 - \varphi[n+1]} & \text{Symbol transitions,} \\ & \varphi[n+1] < 0.5 \\ y[k[n+1]+1] = x[n] - \frac{x[n] - \mu[n+1]}{\varphi[n+1]} & \text{Symbol transitions,} \\ & \varphi[n+1] \geq 0.5 \\ y[m] = x[n], m = \in \{k[n]+1, \ldots, k[n+1]\} & \text{Other samples} \\ & \text{(following transitions)} \end{cases} \qquad (15)$$

Figure 5:
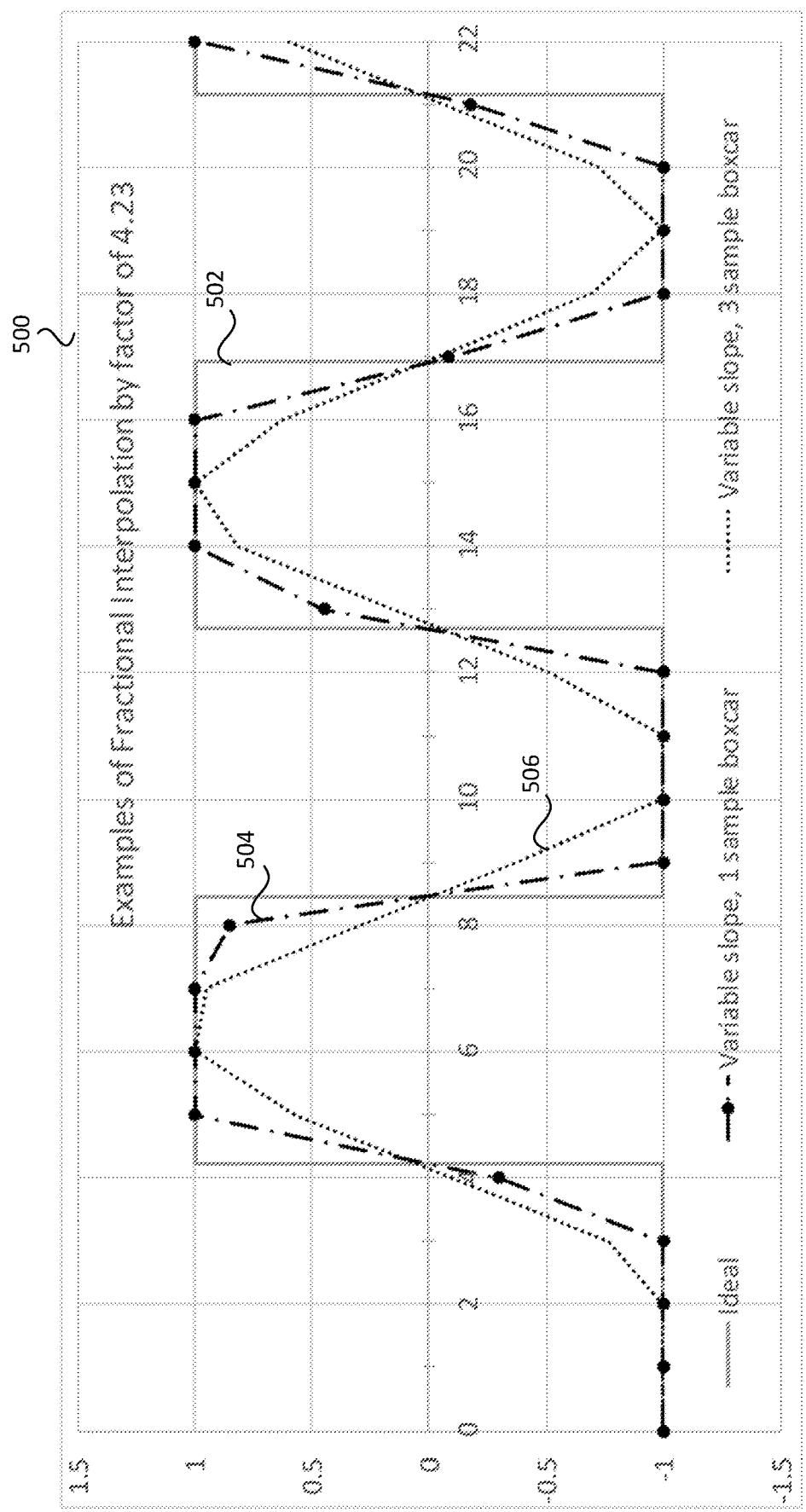
FIG. 5 is a results graph of linear edge interpolation performed according to embodiments of the disclosure.

FIG. 5 illustrates a plot 500 using equations (11)-(15). Plot 500 illustrates an ideal continuous-time waveform 502 (with a unit interval 4.23 times the DAC sample interval), an interpolated waveform 504 using equations (11)-(15), and an interpolated waveform 506 using equations (11)-(15), with a lower-bandwidth output channel.

The performance of each of the embodiments described above is dependent on the bandwidth and frequency response of the DAC 112 and signal source output signal path at port 118, as well as the resolution and other performance characteristics of the DAC 112.

Figure 6:
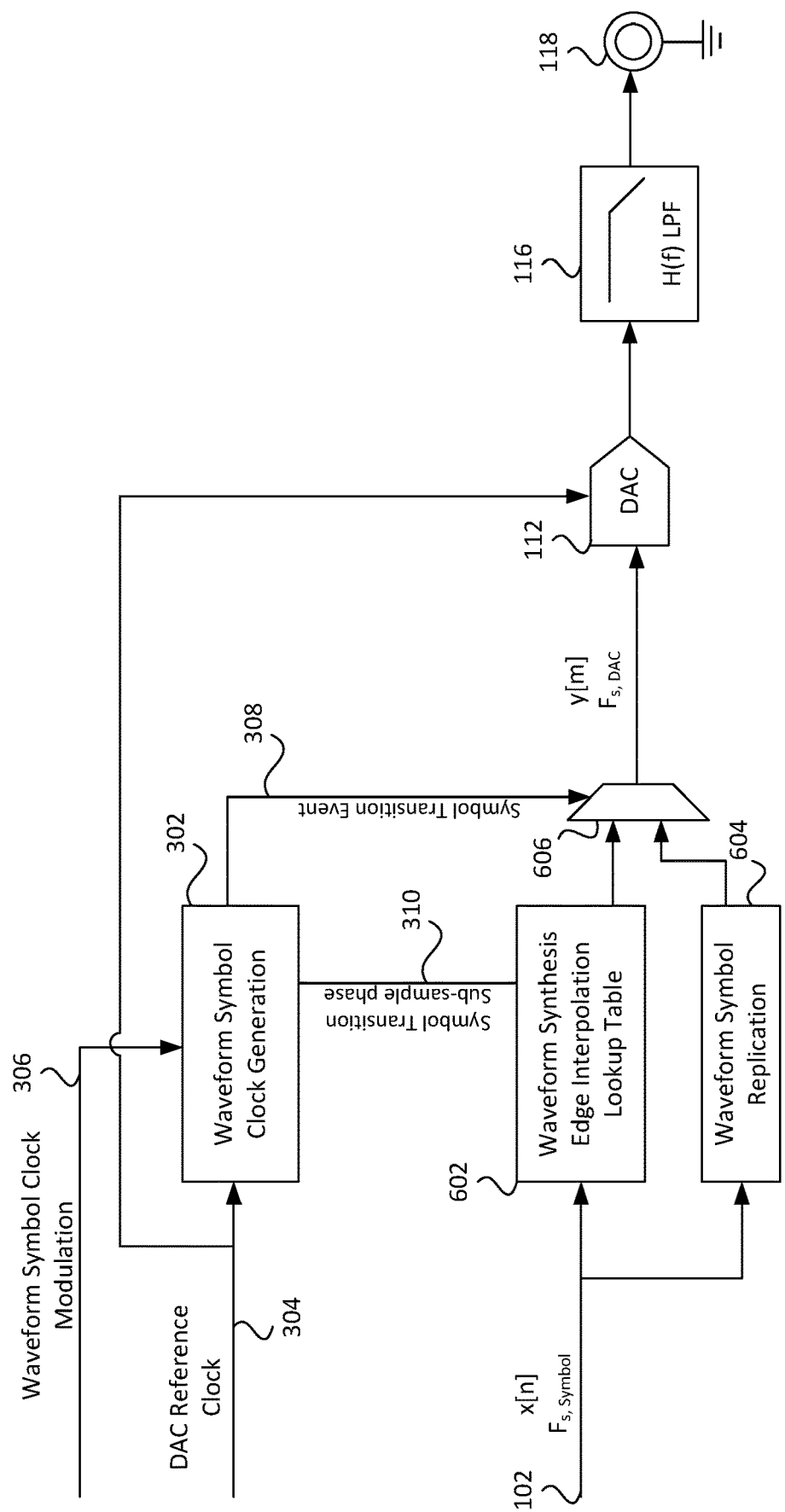
FIG. 6 is a block diagram of a test and measurement instrument having a waveform synthesizer according to other embodiments of the disclosure.

FIG. 6 illustrates another embodiment of the disclosure, which may better optimize the edge interpolation to account for the impact of non-ideal channel frequency response and/or bandwidth limitations, while still having an implementation that is efficient for real-time DSP hardware realization.

The embodiment of FIG. 6 also includes a waveform symbol clock generator 302 that can receive a DAC reference clock 304 and a waveform symbol clock modulation signal 306, and outputs a symbol transition sub-sample phase 310 and the symbol transition event 308.

The input signal 102 is received at both a waveform synthesis edge interpolation look up table 602 and a waveform symbol replicator 604. The output of each the waveform synthesis edge interpolation look up table 602 and the waveform symbol replicator 604, as well as the symbol transition events 308 are sent to a multiplexer 606, which outputs the digital signal, y[m] to be converted to an analog signal at the DAC 112 and filtered at the analog low-pass filter 116, prior to being output to port 118. The multiplexer 606 selects either the output of the waveform syntheses edge interpolation look-up table 602 or the output of the waveform symbol replicator 604 based on the received symbol transition event 308.

The waveform synthesis edge interpolation look up table 602 can generate the DAC sample value that can be used to transition between successive symbol values based on the current symbol value, or the input signal 102, x[n], the next symbol value, x[n+1], and the symbol transition sub-sample phase 310. The waveform synthesis edge interpolation look up table 602 selects DAC sample values that achieve the closest desired sub-sample decision threshold crossing phase between successive DAC samples for a given φ[n] at the output of the port 118, factoring in the aggregate frequency response, bandwidth, and other characteristics of the signal path to the port 118.

The values of the waveform synthesis edge interpolation look up table 602 may be calibrated by characterizing the step response at the port 118 for each possible DAC 112 level in the interpolated edge values between symbol value transitions and then measuring the sub-sample edge decision threshold crossing phase for each DAC 112 level. This information may then be used to generate coefficients to save or store in the waveform synthesis edge interpolation look up table 602 to select the interpolated output DAC sample value to use for each waveform edge that achieves the closest to desired decision threshold crossing phase at the signal source output. The DAC 112 input samples can be replicated between symbol transitions as done with the other edge interpolation methods discussed above.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), Field Programmable Gate Arrays (FPGAs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 a test and measurement instrument, comprising a digital-to-analog converter having an output sample rate configured to receive a digital sample waveform and a reference clock and output an analog waveform at the sample rate; a waveform synthesizer configured to receive an input waveform having a baud rate less than the sample rate of the digital-to-analog converter by a non-integral rational ratio and to provide the digital sample waveform; and a port configured to output the analog waveform.

Example 2 is the test and measurement instrument of example 1, wherein the waveform synthesizer operates in real-time.

Example 3 is the test and measurement instrument of either one of examples 1 or 2, wherein the waveform synthesizer includes: a waveform replicator configured to up-sample the input waveform by an integer factor N, where N is greater than 1; a low-pass filter configured to receive the up-sampled input waveform and remove waveform content above the Nyquist frequency of the digital-to-analog converter; a down-sampler configured to down-sample the filtered up-sampled input waveform to match the output sample rate.

Example 4 is the test and measurement instrument of any one of examples 1-3, further comprising an analog low-pass filter configured to receive the analog signal and remove signal content above a first Nyquist zone of the digital-to-analog converter.

Example 5 is the test and measurement instrument of any one of examples 1-4, wherein the waveform synthesizer includes: a waveform symbol clock generator configured to receive the reference clock and output a symbol transition event and a symbol transition sub-sample phase; and an edge interpolator configured to receive the input waveform, the symbol transition event, and the symbol transition sub-sample and output the digital sample waveform having the baud rate less than the sample rate of the digital-to-analog converter by a rational ratio of baud rate and digital-to-analog sample rate.

Example 6 is the test and measurement instrument of example 5, wherein the edge interpolator is configured to interpolate the digital sample waveform having a baud rate less than the sample rate by linear edge interpolation with a constant slope.

Example 7 is the test and measurement instrument of example 5, wherein the edge interpolator is configured to interpolate the digital sample waveform having a baud rate less than the sample rate by linear edge interpolation with a variable slope.

Example 8 is the test and measurement instrument of example 5 wherein the edge interpolator includes an edge interpolator look-up table configured to receive the input signal and the symbol transition sub-sample phase and output an interpolated edge signal.

Example 9 is the test and measurement instrument of example 5, wherein the waveform symbol clock generator is further configured to receive a waveform symbol clock modulation signal.

Example 10 is a method for synthesizing a waveform, comprising converting a digital sample waveform through a digital-to-analog converter having an output sample rate to an analog waveform at the sample rate; receiving an input waveform having a baud rate; synthesizing a digital sample waveform having a baud rate less than the sample rate through a waveform synthesizer; outputting the analog waveform to a device under test.

Example 11 is the method of example 10, wherein synthesizing the digital sample waveform includes synthesizing the digital sample waveform in real-time.

Example 12 is the method of either one of examples 10 or 11, wherein synthesizing the waveform includes up-sampling the input waveform by an integer factor N, where N is greater than 1; filtering the up-sampled waveform to remove waveform content above the Nyquist frequency of the digital-to-analog converter; down-sampling the filtered up-sampled input waveform to match the fixed output sample rate.

Example 13 is the method of any one of examples 10-12, further comprising filtering the analog signal to remove signal content above a first Nyquist zone of the digital-to-analog converter prior to being outputting the analog waveform.

Example 14 is the method of examples 10-13, wherein synthesizing the waveform includes: generating a symbol transition event and a symbol transition sub-sample phase based on a reference clock used by the digital-to-analog converter; and generating the digital sample waveform having the baud rate less than the sample rate of the digital-to-analog converter based on the input waveform, the symbol transition event, and the symbol transition sub-sample phase.

Example 15 is the method of example 14, wherein generating the digital sample waveform includes interpolating the digital sample waveform having a baud rate less than the sample rate by linear edge interpolation with a constant slope.

Example 16 is the method of example 14, wherein generating the digital sample waveform includes interpolating the digital sample waveform having a baud rate less than the sample rate by linear edge interpolation with a variable slope.

Example 17 is the method of example 14, wherein generating the digital sample waveform includes: selecting an edge signal based on an edge interpolator look-up table configured to receive the input signal and the symbol transition sub-sample phase and output an interpolated edge signal.

Example 18 is the method of example 14, wherein generating the symbol transition event and the symbol transition sub-sample phase is further based on a waveform symbol clock modulation signal.

Example 19 is one or more computer-readable storage media comprising instructions, which, when executed by one or more processors of a test and measurement instrument, cause the test and measurement instrument to convert a digital sample waveform through a digital-to-analog converter having an output sample rate to an analog waveform at the sample rate; receive an input waveform having a baud rate; synthesize a digital sample waveform in real-time having a baud rate less than the sample rate through a waveform synthesizer; and output the analog waveform to a device under test.

Example 20 is the one or more computer-readable storage media of claim 19, further including instructions to synthesize the waveform by: up-sampling the input waveform by an integer factor N, where N is greater than 1; filtering the up-sampled waveform to remove waveform content above the Nyquist frequency of the digital-to-analog converter; and down-sampling by an integer factor, the filtered up-sampled input waveform to obtain the desired output baud rate.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A test and measurement instrument, comprising:
   a digital-to-analog converter having an output sample rate configured to receive a digital sample waveform and a reference clock and output an analog waveform at the sample rate;
   a waveform synthesizer configured to receive an input waveform having a baud rate less than the sample rate of the digital-to-analog converter by a non-integer rational ratio and to provide the digital sample waveform; and
   a port configured to output the analog waveform, wherein the waveform synthesizer operates in real-time,
wherein the waveform synthesizer includes:
- a waveform replicator configured to up-sample the input waveform by an integer factor N, where N is greater than 1;
- a low-pass filter configured to receive the up-sampled input waveform and remove waveform content above the Nyquist frequency of the digital-to-analog converter; and
- a down-sampler configured to down-sample the filtered up-sampled input waveform to match the output sample rate.

2. The test and measurement instrument of claim 1, further comprising an analog low-pass filter configured to receive the analog signal and remove signal content above a first Nyquist zone of the digital-to-analog converter.

3. The test and measurement instrument of claim 1, wherein the down-sampler uses a down-sample factor M that is dithered each sample period of the digital-to-analog converter to achieve a mean down-sample factor matching the output sample rate.

4. A test and measurement instrument, comprising:
- a digital-to-analog converter having an output sample rate configured to receive a digital sample waveform and a reference clock and output an analog waveform at the sample rate;
- a waveform synthesizer configured to receive an input waveform having a baud rate less than the sample rate of the digital-to-analog converter by a non-integer rational ratio and to provide the digital sample waveform; and
- a port configured to output the analog waveform,
wherein the waveform synthesizer operates in real-time,
wherein the waveform synthesizer includes:
  - a waveform symbol clock generator configured to receive the reference clock and output a symbol transition event and a symbol transition sub-sample phase; and
  - an edge interpolator configured to receive the input waveform, the symbol transition event, and the symbol transition sub-sample phase and output the digital sample waveform having the baud rate less than the sample rate of the digital-to-analog converter by a rational ratio of the baud rate and the digital-to-analog converter sample rate.

5. The test and measurement instrument of claim 4, wherein the edge interpolator is configured to interpolate the digital sample waveform having a baud rate less than the sample rate by linear edge interpolation with a constant slope.

6. The test and measurement instrument of claim 4, wherein the edge interpolator is configured to interpolate the digital sample waveform having a baud rate less than the sample rate by linear edge interpolation with a variable slope.

7. The test and measurement instrument of claim 4 wherein the edge interpolator includes:
- an edge interpolator look-up table configured to receive the input signal and the symbol transition sub-sample phase and output an interpolated edge signal.

8. The test and measurement instrument of claim 4, wherein the waveform symbol clock generator is further configured to receive a waveform symbol clock modulation signal.

9. The test and measurement instrument of claim 4, further comprising an analog low-pass filter configured to receive the analog signal and remove signal content above a first Nyquist zone of the digital-to-analog converter.

10. A method for synthesizing a waveform, comprising:
- converting a digital sample waveform through a digital-to-analog converter having a fixed output sample rate to an analog waveform at the sample rate;
- receiving an input waveform having a baud rate less than the output sample rate of the digital-to-analog converter by a non-integer rational ratio;
- synthesizing a digital sample waveform from the input waveform through a waveform synthesizer; and
- outputting the analog waveform to a device under test,
wherein synthesizing the digital sample waveform includes synthesizing the digital sample waveform in real-time,
wherein synthesizing the waveform includes:
- up-sampling the input waveform by an integer factor N, where N is greater than 1;
- filtering the up-sampled waveform to remove waveform content above the Nyquist frequency of the digital-to-analog converter; and
- down-sampling the filtered up-sampled input waveform to match the fixed output sample rate.

11. The method of claim 10, further comprising filtering the analog signal to remove signal content above a first Nyquist zone of the digital-to-analog converter prior to outputting the analog waveform.

12. The method of claim 10, wherein down-sampling comprises using a down-sample factor M that is dithered each sample period of the digital-to-analog converter to achieve a mean down-sample factor matching the output sample rate.

13. A method for synthesizing a waveform, comprising:
- converting a digital sample waveform through a digital-to-analog converter having a fixed output sample rate to an analog waveform at the sample rate;
- receiving an input waveform having a baud rate less than the output sample rate of the digital-to-analog converter by a non-integer rational ratio;
- synthesizing a digital sample waveform from the input waveform through a waveform synthesizer; and
- outputting the analog waveform to a device under test,
wherein synthesizing the digital sample waveform includes synthesizing the digital sample waveform in real-time,
wherein synthesizing the waveform includes:
- generating a symbol transition event and a symbol transition sub-sample phase based on a reference clock used by the digital-to-analog converter; and
- generating the digital sample waveform having a baud rate less than the sample rate of the digital-to-analog converter based on the input waveform, the symbol transition event, and the symbol transition sub-sample phase.

14. The method of claim 13, wherein generating the digital sample waveform includes interpolating the digital sample waveform having a baud rate less than the sample rate by linear edge interpolation with a constant slope.

15. The method of claim 13, wherein generating the digital sample waveform includes interpolating the digital sample waveform having a baud rate less than the sample rate by linear edge interpolation with a variable slope.

16. The method of claim 13, wherein generating the digital sample waveform includes:

selecting an edge signal based on an edge interpolator look-up table configured to receive the input signal and the symbol transition sub-sample phase and output an interpolated edge signal.

17. The method of claim 13, wherein generating the symbol transition event and the symbol transition sub-sample phase is further based on a waveform symbol clock modulation signal.

18. The method of claim 12, further comprising filtering the analog signal to remove signal content above a first Nyquist zone of the digital-to-analog converter prior to outputting the analog waveform.

19. One or more non-transitory computer-readable storage media comprising instructions, which, when executed by one or more processors of a test and measurement instrument, cause the test and measurement instrument to:
  convert a digital sample waveform through a digital-to-analog converter having an output sample rate to an analog waveform at the sample rate;
  receive an input waveform having a baud rate less than the output sample rate of the digital-to-analog converter by a non-integer rational ratio;
  synthesize a digital sample waveform from the input waveform in real-time through a waveform synthesizer; and
  output the analog waveform to a device under test, further including instructions to synthesize the waveform by:
  up-sampling the input waveform by an integer factor N, where N is greater than 1;
  filtering the up-sampled waveform to remove waveform content above the Nyquist frequency of the digital-to-analog converter; and
  down-sampling by an integer factor, the filtered up-sampled input waveform to obtain the desired output sample rate.

20. The one or more non-transitory computer-readable media of claim 19, further including instructions to filter the analog signal to remove signal content above a first Nyquist zone of the digital-to-analog converter prior to outputting the analog waveform.

* * * * *